US009484906B2

(12) United States Patent
Kohout

(10) Patent No.: US 9,484,906 B2
(45) Date of Patent: Nov. 1, 2016

(54) APPARATUS AND METHODS OF N-TYPE LOAD SWITCH USING BOOTSTRAP GATE DRIVE FOR WIRELESS POWER RECEIVER

(71) Applicant: Active-Semi, Inc., Road Town, Tortola (VG)

(72) Inventor: James A. Kohout, Dallas, TX (US)

(73) Assignee: Active-Semi, Inc. (VG)

( * ) Notice: Subject to any disclaimer, the term of this patent is extended or adjusted under 35 U.S.C. 154(b) by 547 days.

(21) Appl. No.: 14/050,229

(22) Filed: Oct. 9, 2013

(65) Prior Publication Data

US 2015/0097439 A1    Apr. 9, 2015

(51) Int. Cl.
   *H03K 17/082*   (2006.01)
   *H02J 7/02*    (2016.01)
   *H03K 17/691*   (2006.01)
   *H02H 3/20*    (2006.01)

(52) U.S. Cl.
   CPC ........... *H03K 17/0822* (2013.01); *H02J 7/025* (2013.01); *H03K 17/691* (2013.01); *H02H 3/20* (2013.01)

(58) Field of Classification Search
   CPC . H03K 17/0822; H03K 17/691; H02J 7/025; H02H 3/20; H01F 38/14
   USPC ........................................................ 307/104
   See application file for complete search history.

(56) References Cited

U.S. PATENT DOCUMENTS

| 3,988,617 A | 10/1976 | Price ............................. 326/97 |
| 5,502,632 A | 3/1996 | Warmerdam et al. .......... 363/98 |
| 5,767,631 A * | 6/1998 | Konopka ............. H02H 7/1227 315/127 |
| 9,024,604 B2 * | 5/2015 | Oki ......................... H02M 1/32 323/282 |
| 2002/0047629 A1 | 4/2002 | Kastner ........................ 315/291 |
| 2012/0293008 A1 | 11/2012 | Park et al. .................... 307/104 |
| 2013/0099588 A1 | 4/2013 | Yeo et al. ..................... 307/104 |
| 2013/0176652 A1 | 7/2013 | Kim et al. ....................... 361/86 |
| 2014/0043875 A1 * | 2/2014 | Hsin ......................... G05F 1/56 363/77 |
| 2014/0049159 A1 * | 2/2014 | Kumar .................. H05B 41/16 315/34 |

* cited by examiner

*Primary Examiner* — Jung Kim
*Assistant Examiner* — James Evans
(74) *Attorney, Agent, or Firm* — Imperium Patent Works; Helen Z. Mao; Darien K. Wallace

(57) ABSTRACT

Apparatus and methods are provided to power an N-type load switch using a bootstrap capacitor. In one embodiment, an integrated circuit for a wireless power receiver comprises a first rectifier input terminal (RX1), a second rectifier input terminal (RX2), a first bootstrap terminal (HSB1), a second bootstrap terminal (HSB2), and a load switch terminal (LSW). A first and a second bootstrap circuit are coupled with HSB1 and HSB2 to power the rectifier in a regular mode. A load switch driver circuit is coupled between LSW and either HSB1 or HSB2. In the regular mode the load switch driver circuit powers a load switch through a corresponding bootstrap circuit. In an output shutdown mode, an output shutdown circuit is turned on to turn off the load switch. In one embodiment, the load switch is external to the integrated circuit. In another embodiment, the load switch is internal to the integrated circuit.

20 Claims, 14 Drawing Sheets

WIRELESS POWER RECEIVER POWER PICK UP CIRCUIT

SYSTEM DIAGRAM OF WIRELESS POWER SYSTEM

BOOTSTRAP OVP COMBINATION CLAMP CIRCUIT WHERE TWO
OVP SWITCHES ARE CONNECTED TO THE RECTIFIED OUTPUT

BOOTSTRAP OVP COMBINATION CLAMP CIRCUIT WITH
OVP SIGNAL APPLIED TO BOOTSTRAP CIRCUIT

WIRELESS POWER RECEIVER
OPERATING IN THE OVP MODE

WIRELESS POWER RECEIVER
OPERATING IN THE REGULAR MODE

APPARATUS AND METHODS OF N-TYPE LOAD SWITCH USING BOOTSTRAP GATE DRIVE FOR WIRELESS POWER RECEIVER

TECHNICAL FIELD

The present disclosure relates generally to wireless power/wireless charging system, and more particularly to power receiver of a wireless power system.

BACKGROUND INFORMATION

The concept of wireless power has been developed for a long time. It is only in recent years, however, with the rapid development of the microprocessor, that wireless power has become a viable solution. Today, wireless technology is growing at an exponential rate, with everything from phones to consumer electronics being wirelessly connected. Despite the rapid development in the technology, battery life of these devices remains a problem. Wireless power or wireless charging is designed to solve these problems.

Wireless power is also known as inductive charging. It requires two coils, a transmitter coil and a receiver coil. An alternating current passes through the transmitter coil, generating a magnetic field. The magnetic field induces a voltage in the receiver coil, which can be used to power an external load, such as to power a mobile device or to charge a battery.

In a wireless power/wireless charging system, a transmitter is connected with a power source. The transmitter contains a primary coil that generates a magnetic field. When a receiver, which has a secondary coil, makes contact or is in close proximity to the transmitter, the transmitter and the receiver are magnetically coupled. Power transfers from the transmitter through coupled inductors, such as an air core transformer. The receiver takes the inputs from the secondary coil, and passes it through a rectifier circuit. For efficiency purposes, the rectifier circuit is normally a controlled full bridge rectifier, which uses field-effect transistors (FETs). A bootstrap circuit powers the high side FETs in the rectifier circuit. The bootstrap circuit powers the high side FETs using two external capacitors, which are connected to the integrated circuit through two high side bootstrap terminals.

In modern integrated circuit designed for wireless power devices, the amount of power transferred is controlled by internal control circuits. Control signals are transmitted from the receiver to the transmitter based on detected conditions at the receiver to increase or decrease power. Further, the receiver monitors receiver conditions and triggers internal protection mechanisms.

One of the internal protection mechanisms in the receiver circuit is an over voltage protection (OVP) circuit. The receiver monitors the output voltage. When the output voltage reaches a level that is greater than a predefined value, an error signal is generated. Upon detecting of the OVP condition, an OVP circuit is enabled to clamp the input voltage so that the output voltage can drop to the predefined level. Upon the output voltage returning to the predefined level, the OVP circuit is disabled and the receiver returns to regular operation mode. Using two capacitors to clamp the AC input is a proven solution for wireless power circuit. The dual capacitor OVP circuit uses capacitor OVP circuit uses direct capacitive coupling across the inputs to clamp the input. Typically, two external capacitors are needed for the OVP circuit to clamp the inputs terminals, and two OVP terminals are used for the OVP circuit to connect to two external OVP capacitors.

In addition to over voltage protection, a wireless power integrated circuit may also include a separate output shutdown switch to shut off the output when certain predefined conditions are detected. The output shutdown switch, also known as a load switch, can be a P-type switch, such as a PMOS, which is easy to drive. However, a PMOS is about twice the price of an N-type switch, such as an NMOS for the same Drain-Source On-Resistance (RDS(on)) and Voltage rating. It is very beneficial to change this to an NMOS. However, to get the lowest RDS (on) possible, the gate of the NMOS needs to be driven some voltage above the supply to fully enhance the NMOS.

There are two traditional designs to drive the gate of the NMOS so that the less expensive NMOS can be used as the output shutdown switch. The first is to use an internal charge pump that drives the NMOS shutdown switch. The internal charge pump, however, requires a large switching capacitor. It also requires a large die area. The second solution is to use an external charge pump that does not require a large die area. However, an external charge pump requires two terminals with High Voltage Electrostatic Discharge (ESD) cells, additional external components and more pins on the package. Improvements are needed for the integrated circuit for a wireless power receiver.

FIG. 1 shows prior art circuit diagram of an integrated circuit 1 for a wireless power receiver.

Integrated circuit 1 has two input terminals RX1 11, RX2 12, and a ground terminal GND 10. Series capacitor 3 and parallel capacitor 4 make up the dual resonant circuit with a secondary coil 2. Secondary coil 2 receives power from a power-transmitter coil in a power transmitter unit and passes through the secondary dual resonant circuit. The Dual resonant circuit enhances the power transfer efficiency and enables a resonant detection method.

A full bridge rectifier circuit 40, coupled between an input terminal RX1 11 and an input terminal RX2 12, provides full-wave rectification of the AC waveform received from RX1 11 and RX2 12. The output of rectifier circuit 40 is connected to a rectifier output terminal RECTO 15 and terminal GND 10.

A bootstrap circuit 30 is used to power rectifier circuit 40. Two external bootstrap capacitors, bootstrap capacitor 5 and bootstrap capacitor 6 are connected to a bootstrap terminal HSB1 13 and a bootstrap terminal HSB2 14. A low voltage power, e.g. 5-volt, charges the bootstrap capacitors through a bootstrap diode 31 and a bootstrap diode 32, respectively. The bootstrap circuit, therefore, provides power to high side switches of rectifier circuit 40 in normal operation.

Integrated circuit 1 in FIG. 1 also has an OVP circuit 20 that includes an OVP switch 21 and an OVP switch 22. OVP switch 21 is coupled between an OVP clamping terminal CLMP1 25 and the ground. OVP switch 22 is coupled between an OVP clamping terminal CLMP2 26 and the ground. A signal OVP 29 drives OVP switch 21 and OVP switch 22. An external OVP capacitor 23 is coupled between RX1 11 and CLMP1 25. Another external OVP capacitor 24 is coupled between RX2 12 and CLMP2 26. When signal OVP 29 is asserted asserted upon detecting an OVP condition, OVP switch 21 and OVP switch 22 turn on and pull CLMP1 25 and CLMP2 26 to the ground. External OVP capacitors 23 and 24 provide capacitive coupling between RX1 11 and RX2 12 and therefore clamp the input. The output voltage at RECTO 15 will drop back to the predefined level accordingly.

The prior art provides over voltage protection. However, the OVP circuit requires two additional capacitors and two additional terminals. Although integrated circuit 1 provides a working solution for over voltage protection, it requires additional capacitors and terminals.

FIG. 1 also shows an output shutdown circuit 50. Output shutdown circuit 50 detects different signals and outputs an output shutdown signal when one or more predefined conditions are met. An external load switch 7 is coupled between a load switch (LSW) terminal 16 and RECTO 15. Load switch 7 can be either an N-type switch or a P-type switch. An N-type switch includes, but is not limited to, NMOS or NPN. A P-type switch includes, but is not limited to, PMOS. A P-type switch, which uses a simpler gate drive, is much more expensive than an N-type switch. An N-type switch, however, requires gate drive that drives the voltage above the supply. As shown in FIG. 1, a charge pump 51 is used to provide gate drive to N-type load switch 7. A charge pump capacitor 52 is needed to power load switch 7. This design requires an additional capacitor 52 and takes a lot of die area. Capacitor 52 can be externally connected to integrated circuit 1. To be able to connect capacitor 52 externally, two additional terminals are needed. Either an internal charge pump or an external charge pump requires additional capacitors. It also requires either a larger die area or two additional terminals.

Methods and structures for improving such wireless power receiver are sought.

SUMMARY

Apparatus and methods are provided for a wireless power receiver. In one novel aspect, apparatus and method are provided to use the same bootstrap capacitors and bootstrap terminals for an over voltage protection circuit.

In one embodiment of the current invention, an integrated circuit for a wireless power receiver comprises a first rectifier input terminal RX1, a second rectifier input terminal RX2, a first bootstrap terminal HSB1, a second bootstrap terminal HSB2. A first and a second bootstrap circuit are coupled to HSB1 and HSB2 to power the rectifier circuit in a regular mode. An over voltage protection (OVP) circuit is coupled between HSB1 and HSB2. The OVP circuit is turned on to connect HSB1 and HSB2 together in an OVP mode.

In another embodiment of the current invention, an integrated circuit for a wireless power receiver comprises a first rectifier terminal RX1, a second rectifier input terminal RX2, a first bootstrap terminal HSB1, a second bootstrap terminal HSB2, and a means for providing power to the rectifier circuit through HSB1 and HSB2 in a regular mode, wherein the means is also for providing over voltage protection (OVP) through HSB1 and HSB2 in an OVP mode.

Apparatus and methods are also provided to provide gate drive to an N-type switch using a bootstrap capacitor. In another novel aspect, apparatus and methods are provided to use a bootstrap circuit to provide gate drive for a N-type load switch.

In one embodiment of the current invention, an integrated circuit for a wireless power receiver comprises a first rectifier input terminal RX1, a second rectifier input terminal RX2, a first bootstrap terminal HSB1, a second bootstrap terminal HSB2. A first and a second bootstrap circuit are coupled to HSB1 and HSB2 to power the rectifier circuit in a regular mode. A load switch (LSW) driver circuit is coupled between the LSW terminal and either HSB1 or HSB2. In the regular mode the LSW driver circuit powers a load switch through a corresponding bootstrap circuit. In an output shutdown mode, an output shutdown circuit is turned on to turn off the load switch.

In another embodiment of the current invention, an integrated circuit for a wireless power receiver comprises a first rectifier input terminal RX1, a second rectifier input terminal RX2, a first bootstrap terminal HSB1, a second bootstrap terminal HSB2. A first and a second bootstrap circuit are coupled to HSB1 and HSB2 to power the rectifier circuit in a regular mode. An output shutdown circuit is turned on in an output shutdown mode to turn off a load switch. The integrated circuit also includes a means for powering the load switch in the regular mode through either HSB1 or HSB2 using a corresponding bootstrap circuit.

In another embodiment of the current invention, the load switch is an internal switch of the integrated circuit. In another embodiment of the current invention, the load switch is an external switch of the integrated circuit.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 2:
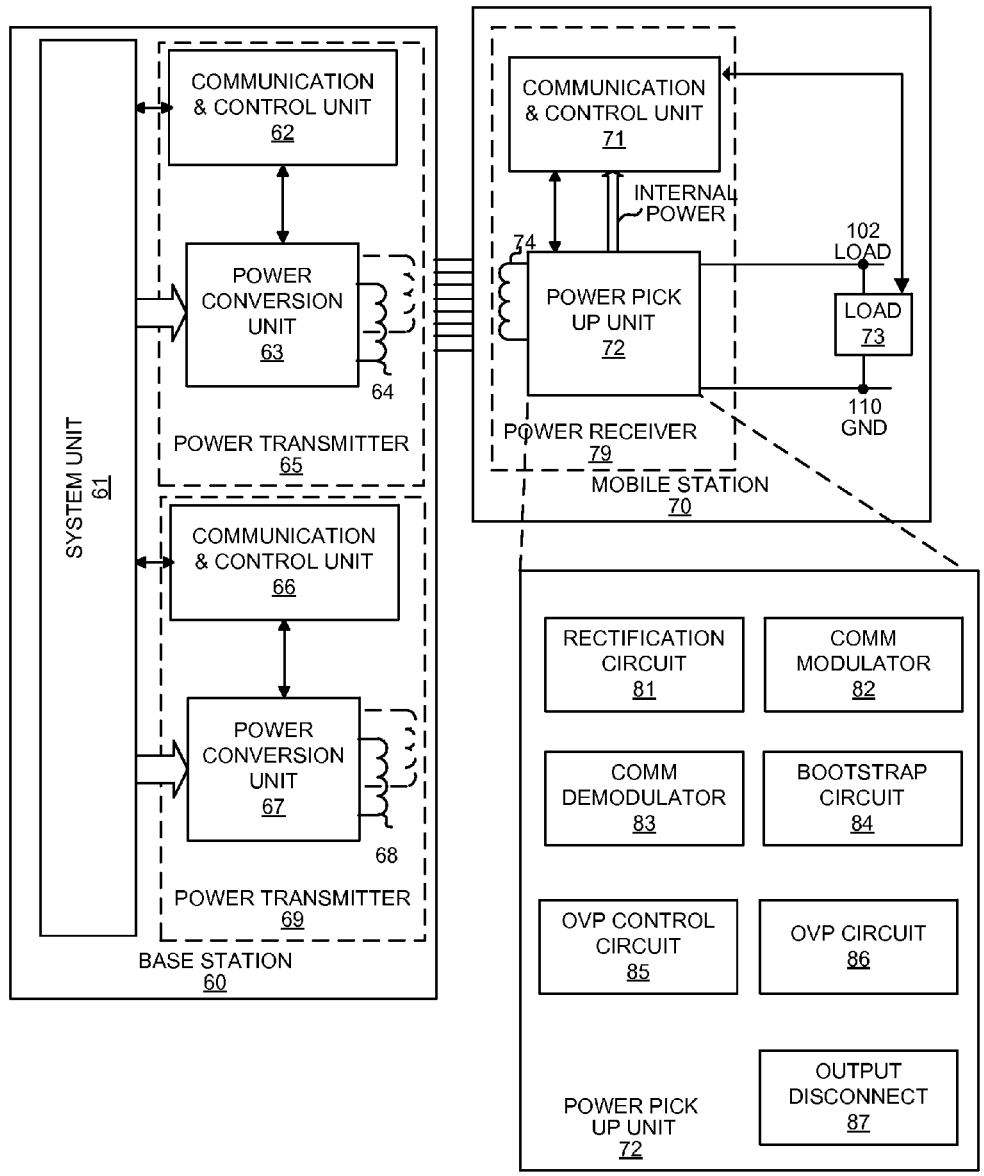
FIG. 2 is a system diagram of a wireless power system.

FIG. 2 is a system diagram of a wireless power system. The wireless power system comprises a base station 60 and a mobile station 70. Base Station 60 is a power transmitter unit, which comprises a system unit 61, and one or more power transmitters, such as a power transmitter 65 and a power transmitter 69. A power transmitter in base station 60 normally has a communication and control unit, a power conversion unit, and a primary coil array. As shown, a power transmitter 65 contains a communication and control unit 62, a power conversion unit 63, and a primary coil array 64. Control and communication unit 62 regulates the transferred power to the level that the power receiver requests. Primary coil array 64 generates the magnetic field for power conversion unit 62. As shown in FIG. 2, base station 60 may contain multiple transmitters. For example, power transmitter 69 contains a communication and control unit 65, a power conversion unit 66, and primary coil array 67. System unit 61 comprises functional modules such as an input power provisioning module, controller of multiple power transmitters, and a user interface module.

FIG. 2 also shows functional blocks of mobile station 70. Mobile station 70 includes power receiver 79 and a load unit 73. Power receiver 79 has a communication and control unit 71, a power pick up unit 72, and a secondary coil 74. Secondary coil 74 captures the magnetic field for power pick up unit 72. Power pick up unit 72, unlike the power transmitter, normally has only one secondary coil. Mobile station 70, unlike base station 60, normally contains one power receiver. Communication and control unit 71 regulates the transferred power to the level that is appropriate for the subsystems connected to the output of the power receiver. Power pick up unit 72 output load voltage through 102 load and 110 ground (GND). Load unit 73 receives power from power receiver 79 via 102 load and 110 GND. Load unit 73 communicates sensing and control information with communication and control unit 71. For example, load unit 73 may contain a circuit that measures the temperature of a rechargeable battery.

FIG. 2 further shows a detailed view of functional modules of power pick up unit 72. Power pick up unit 72 includes a rectification circuit 81, a communication modulator 82, a communication demodulator 83, a bootstrap circuit 84, an OVP control circuit 85, an OVP circuit 86 and an output disconnect circuit 87. Rectification circuit 81 provides full-wave rectification of the alternating current (AC) waveform, using a full bridge rectifier. Communication modulator 82 typically consists of a resistor or capacitor in series with a switch, modulates signals to be transmitted to communication and control unit 71. Communication demodulator 83 demodulates signals received from communication and control unit 71. Bootstrap circuit 84 provides power to the high side switches of rectifier circuit 81. Bootstrap circuit 84 typically connects with external bootstrap capacitors through bootstrap terminals. OVP control circuit 85 detects over voltage conditions and sends OVP signals. When an over voltage condition is detected, power pick up unit 72 changes from the regular operation mode to the OVP operation mode. OVP circuit 86 clamps input when over voltage conditions are detected. OVP circuit 86 also requires capacitors. In one embodiment of the current invention, OVP circuit 86 and bootstrap circuit 84 share the same capacitors because the bootstrap circuit 84 operates during the regular operation mode and is off in the OVP operation mode. On the other hand, OVP circuit 86 operates in OVP operation mode and is off in the regular operation mode.

Output disconnect circuit 87 prevents current from flowing to the output when certain conditions are met. In addition, output disconnect circuit 87 prevents current back flow into power receiver 79. Further, output disconnect circuit 87 minimizes the power that power receiver 79 draws from a power transmitter when a power signal is first applied to secondary coil 74.

In some embodiments of the current invention, the wireless power receiver complies with the standard of the Wireless Power Consortium (WPC), which provides wireless charging to mobile devices as well as being used in other wireless power applications. In some embodiments of the current invention, the integrated circuit for the wireless power pick up unit complies with the standard of the WPC to be used in a wireless power receiver.

Bootstrap and Over Voltage Combination Clamp

As shown in FIG. 2, both bootstrap circuits and an OVP circuit are critical to a power pick up unit in a wireless power system. Integrated circuits are designed to implement the functions of a power pick up unit. As most of such integrated circuits include bootstrap circuits for a rectifier and an OVP circuit for over voltage conditions, multiple capacitors are required, normally separately for the bootstrap circuits and the OVP circuit. However, as discussed in the system diagram, the bootstrap circuit powers the rectifier. Therefore, it only operates during the regular operation mode. The OVP circuit, on the other hand, is turned off during the regular operation mode. Similarly, in the OVP operation, the bootstrap circuits is turned off and the OVP circuit is turned on. Therefore, the bootstrap circuit and the OVP circuit can share terminals and external capacitors to provide the same required functions.

Figure 3:
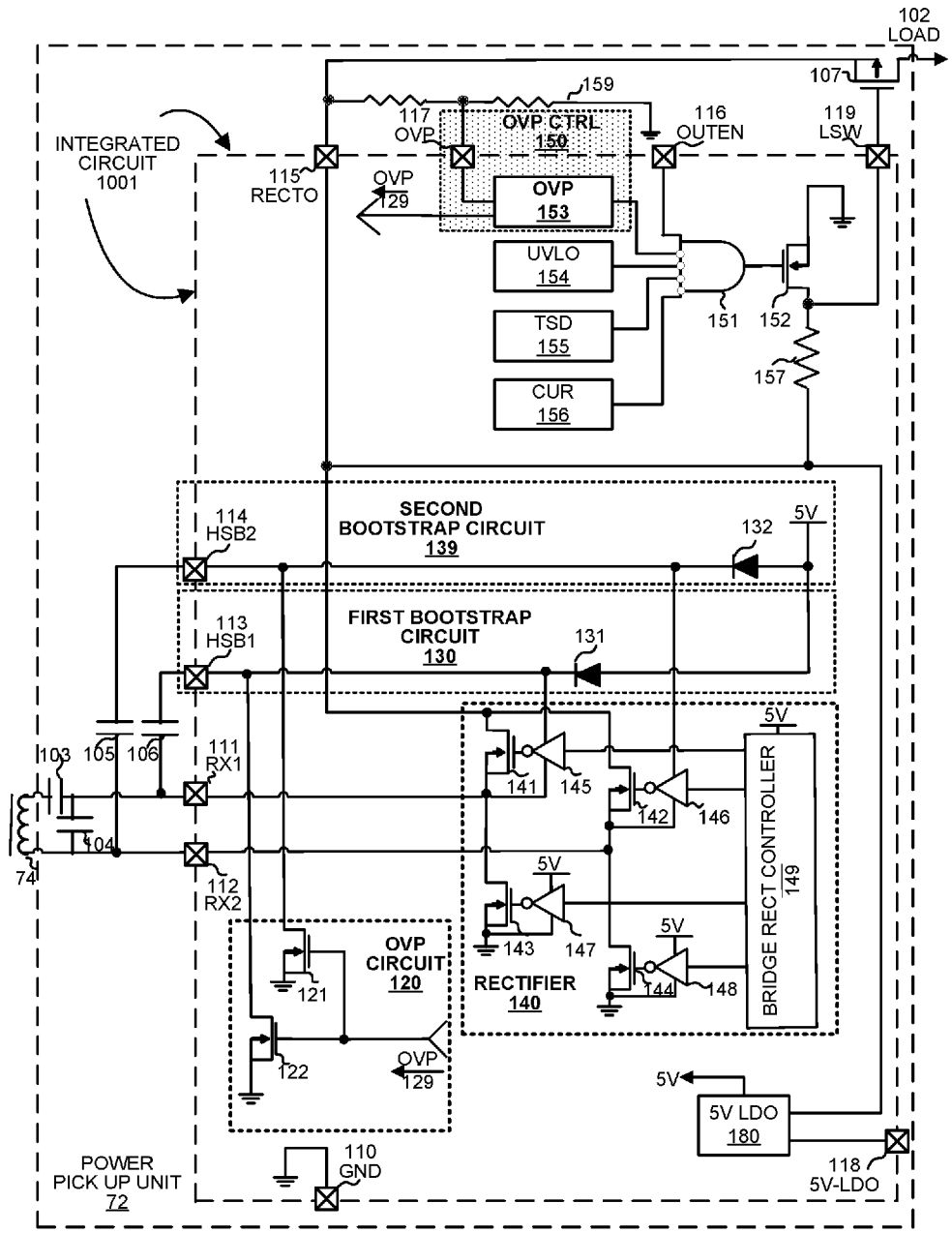
FIG. 3 shows an exemplary integrated circuit for a wireless power receiver without clamping terminal and OVP capacitors.

FIG. 3 shows an exemplary integrated circuit 1001 for a wireless power receiver without clamping terminal and OVP capacitors. FIG. 2 shows a secondary coil 74 and a power pick up unit 72, which includes an integrated circuit 1001. Integrated circuit 1001 has two input terminals RX1 111 and RX2 112, two high side bootstrap terminals HSB1 113 and HSB2 114, an output terminal RECTO 115 and a ground terminal GND 110. Integrated circuit 1001 has a rectifier circuit 140, a first bootstrap circuit 130 and a second bootstrap 139, an OVP circuit 120, and an OVP control circuit 150. In addition, integrated circuit 1001 also has a five-volt load output (LDO) terminal 118. Five-volt load output circuit 180 is connected to the rectified output terminal 115 and a 5V LDO terminal 118.

A series capacitor 103 and a parallel capacitor 104 make up the dual resonant circuit with a secondary coil 74. Secondary coil 74 receives power from a power-transmitter coil in a power transmitter unit and passes through the secondary dual resonant circuit. The dual resonant circuit enhances the power transfer efficiency and enables a resonant detection method.

A full bridge rectifier circuit 140, coupled between input terminal RX1 111 and input terminal RX2 112, provides full-wave rectification of the AC waveform received from RX1 111 and RX2 112. The output of rectifier circuit 140 is connected to rectifier output terminal RECTO 115. An external output capacitor 107 is connected to RECTO 115 to perform output smoothing. Rectifier circuit 140 has two high side rectifier switches 141 and 142. Rectifier circuit 140 also has two low side rectifier switches 143 and 144. Each rectifier switch 141, 142, 143 and 144 is controlled by a bridge rectifier controller 149 and is each connected with inverters 145, 146, 147 and 148, respectively. Full bridge rectifier circuit 140 uses bootstrap circuits to power its two high side switches.

Bootstrap circuit 130 of integrated circuit 1001 includes a bootstrap diode 131 that is connected to HSB1 113 and a low power source. The low power source as shown in FIG. 3 is 5 volts. Bootstrap circuit 130 powers high side switch 141 via inverter 145. Similarly, bootstrap circuit 139 of integrated circuit 1001 includes bootstrap diode 132 that is connected to HSB2 114 and the low power source. Bootstrap circuit 139 powers high side switch 142 via inverter 146. An external bootstrap capacitor 106, coupled between RX1 111 and HSB1 113, is charged when high side switch 141 is turned off. External bootstrap capacitor 106 provides power to high side switch 141 when high side switch 141 is turned on. Similarly, an external bootstrap capacitor 105, coupled between RX2 112 and HSB2 114, is charged when high side switch 142 is turned off. External bootstrap capacitor 105 provides power to high side switch 141 when high side switch 142 is turned on.

External capacitors 105 and 106 are operative for bootstrap circuits 139 and 130 to provide power to rectifier circuit 140 during normal operation. During an over voltage protection mode, however, rectifier circuit 140 does not need bootstrap circuits to provide power. Therefore, external capacitors 105 and 106 do not operate as bootstrap capacitors during OVP mode. In one embodiment of the current invention, the two external capacitors are used as dual capacitor for OVP circuit during OVP mode. HSB1 and HSB2 function as clamping terminals that connect external capacitors 105 and 106 to an operative OVP circuit in the OVP mode.

OVP circuit 120, as shown in FIG. 3, is coupled between HSB1 and HSB2. OVP circuit 120 includes OVP switch 121 and OVP switch 122. In one embodiment of the current invention, OVP switch 121 is coupled between HSB1 113 and the ground, and OVP switch 122 is coupled between HSB2 114 and the ground. An OVP signal 129 drives both OVP switches 121 and 122. During the regular operation, OVP signal 129 is deasserted and OVP switches 121 and 122 are turned off. Therefore, during the regular mode, OVP circuit 120 is turned off. External capacitors 105 and 106 operate as bootstrap capacitors as described in the bootstrap circuits. When OVP signal 129 is asserted, both OVP switches 121 and 122 are turned on. OVP switch 121 pulls down one plate of external capacitor 105 to the ground. Similarly, OVP switch 122 is turned on and pulls down one plate of external capacitor 106 to the ground. Inputs RX1 111 and input RX2 112 are capacitive coupled. The AC input from RX1 111 and RX2 112 are temporarily clamped. During the OVP mode, rectifier circuit 140 is not operative. Therefore, external capacitors 105, 106 and terminals HSB1 and HSB2 are reused for OVP circuit 120 to provide dual capacitive coupling function without adding additional terminals and external capacitors.

OVP circuit is driven by OVP signal 129. FIG. 3 also shows control circuits. Logic gate 151 takes different input signals and outputs a control signal. Control switch 152 is coupled between RECTO 115 through a resistor 157 and the ground. The output signal of logic gate 151 drives control switch 152. Control switch 152 drives an external load switch 107 through a load switch terminal LSW 119. The inputs of logic gate 151 can be various internal conditions. Examples of internal condition detection circuits include, over voltage protection (OVP) circuit 153, under voltage lockout (UVLO) circuit 154, thermal shutdown (TSD) circuit 155, current limit and sense circuit 156. The input signal limit and sense circuit 156. The input signal can also include external signals, such as output enable signal from output enable terminal OUTEN 116.

OVP control circuit 150 detects over voltage condition and outputs OVP signal 129. OVP signal 129 is asserted when the rectified output exceeds a predefined value. OVP signal 129 is deasserted when the rectified output goes below the predefined value. In one embodiment of the current invention, OVP control circuit 150 uses external variable or fix resistor. A resistor 159 is externally coupled between RECTO 115 and the ground. Resistor 159 detects an OVP condition and sends input to OVP detection module 153. Resistor 159 is externally connected via OVP terminal 117. In another embodiment of the current invention, resistor 159 can also be internally connected without requiring an OVP terminal. When OVP resistor is externally connected, it provides more flexibility to adjust the predefined voltage range for OVP. When OVP resistor is internally connected, OVP terminal 117 is not required. However, internally connected OVP resistor provides less flexibility to adjust the predefined voltage range for OVP.

There are different ways to design OVP circuit 120 such that OVP circuit 120 can share bootstrap terminals and external bootstrap capacitors. The goal for OVP circuit 120 is to clamp RX1 111 and RX2 112 in the OVP mode by turning on OVP circuit 120. By sharing bootstrap capacitor 105 and 106 through HSB1 and HSB2, OVP circuit 120 can achieve the goal by connecting HSB1 and HSB2 together when the OVP mode is entered. For an OVP circuit that has two OVP switches, the first OVP switch is coupled between HSB1 and a common OVP node, and the second OVP switch is coupled between HSB2 between HSB2 and a common OVP node.

Figure 4:
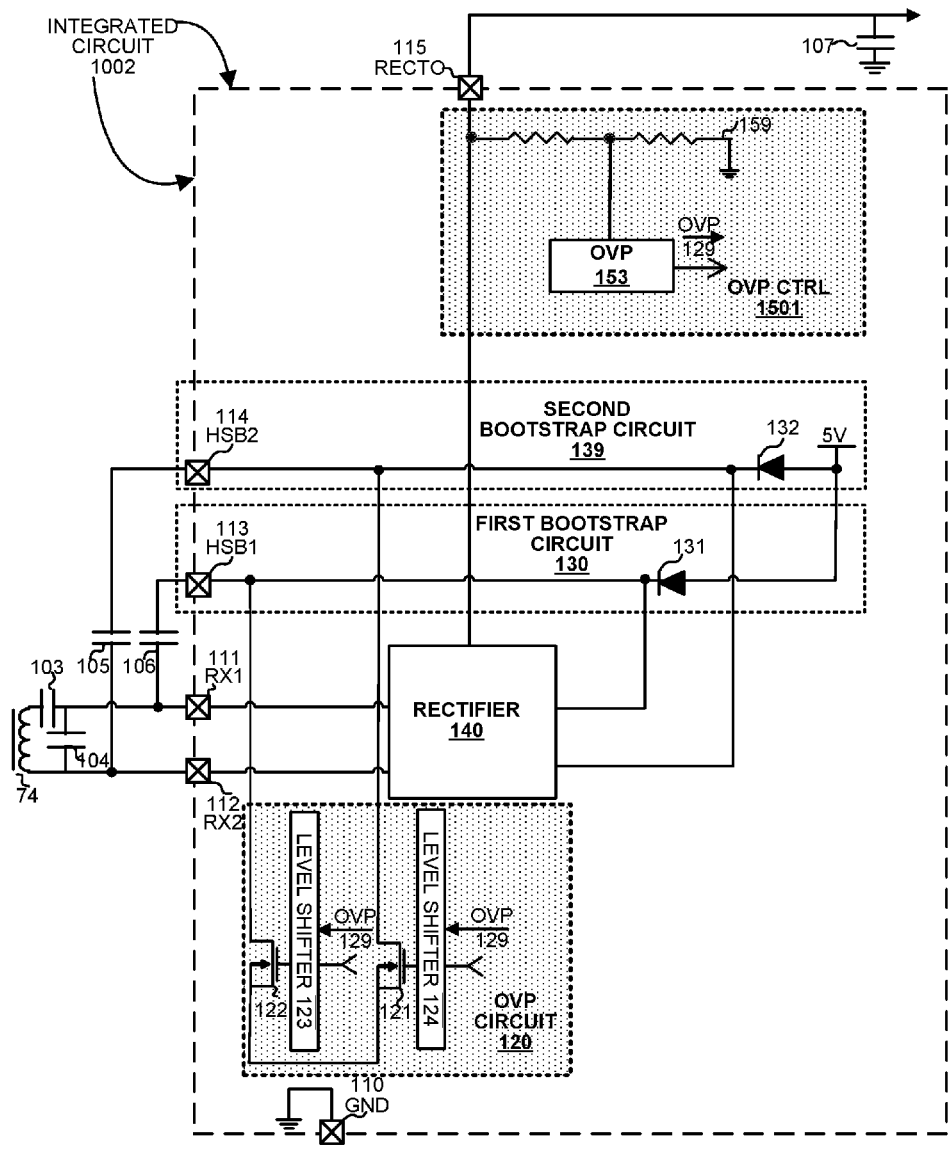
FIG. 4 shows an exemplary circuit diagram of an integrated circuit for a wireless power receiver where the two OVP switches are shorted together.

FIG. 4 shows an exemplary circuit diagram of an integrated circuit 1002 for a wireless power receiver where the two OVP switches are shorted together. Integrated circuit 1002 has a bootstrap circuit 130 and a bootstrap circuit 139 that power high side switches of a rectifier 140. OVP circuit 120 includes an OVP switch 121 and an OVP switch 122. The source of OVP switches 121 and 122 are shorted. Level shifters 123 and 124 level shift a signal OVP 129. The level-shifted signal OVP 129 drives both gates of OVP switch 121 and OVP switch 122. In the regular mode, OVP switch 121 and OVP switch 122 are turned off. Therefore, HSB1 113 and HSB2 114 are not connected. External capacitors 105 and 106 are connected with bootstrap circuit 139 and bootstrap circuit 130, respectively. In the regular mode, bootstrap circuit 130 and bootstrap circuit 139 power rectifier 140.

In the OVP mode, OVP switch 121 and OVP switch 122 are turned on. Since the source of OVP switch 121 and the source of OVP switch 122 are shorted, HSB1 and HSB2 are directly connected. In the OVP mode, RX1 111 and RX2 112 are coupled through external capacitors 105 and 106. In the OVP mode, bootstrap circuits 130 and 139 are not operative. Therefore, external capacitor 105 and 106 are used for OVP circuit 120 in the OVP mode.

FIG. 4 also shows OVP control circuit 1501. OVP control circuit 1501 does not have an OVP terminal. Resistor 159 is internally coupled to RECTO 115 and the ground. OVP detection module 153 takes input from resistor 159 and decides whether the rectified output at RECTO 115 exceeds a predefined threshold. If OVP control circuit 1501 detects that the rectified output is greater than a predefined value, signal OVP 129 is asserted. Integrated circuit 2002 enters the OVP mode. OVP circuit 120 is turned on. When the rectified output is dropped back to the predefined value, signal OVP 129 is deasserted. Integrated circuit 1002 enters the regular mode.

Figure 5:
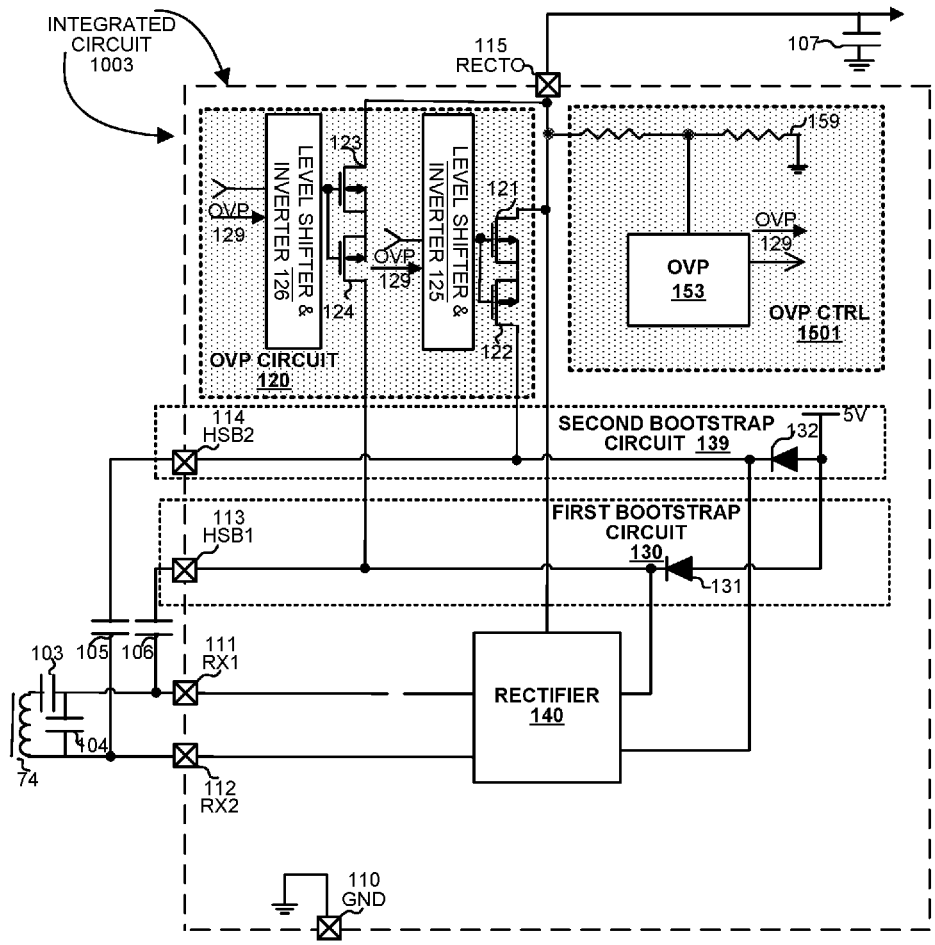
FIG. 5 shows an exemplary circuit diagram of an integrated circuit for a wireless power receiver where the sources of two OVP switches are connected to the rectified output.

FIG. 5 shows an exemplary circuit diagram of an integrated circuit 1003 for a wireless power receiver where the sources of two OVP switches are connected to the rectified output. Integrated circuit 1003 has bootstrap circuit 130 and bootstrap circuit 139, which power rectifier 140 during the regular mode. Integrated circuit 1003 also includes OVP circuit 120. OVP circuit 120 has a pair of back to back connected OVP switches 121, 122, and OVP switches 123, 124. OVP switches 121 and 122 are coupled between HSB2 114 and RECTO 115. OVP switches 123 and 124 are coupled between HSB1 113 and RECTO 115. OVP circuit 120 also has a level shifter & inverter 125 and a level shifter & inverter 126. OVP signal 129 is level shifted (and inverted) via level shifter & inverter 125 and 126. The level shifted and inverted OVP signal 129 is applied to OVP switches 121, 122, 123, and 124. In the regular mode, OVP switches 121, 122, 123 and 124 are turned off. Therefore, HSB1 113 and HSB2 114 are not connected. External capacitors 105 and 106 are connected with bootstrap circuit 130 and bootstrap circuit 139, respectively. In the regular mode, bootstrap circuit 130 and bootstrap circuit 139 power rectifier 140.

In the OVP mode, OVP switch 121 and OVP switch 122 are turned on. Since the source of OVP switch 121 and the source of OVP switch 122 are both connected to RECTO 115, HSB1 and HSB2 are connected together to RECTO 115. In the OVP mode, RX1 111 and RX2 112 are coupled through external capacitors 105 and 106. In the OVP mode, bootstrap circuits 130 and 139 are not operative. Therefore, external capacitor 105 and 106 are used for OVP circuit 120 in the OVP mode.

Figure 6:
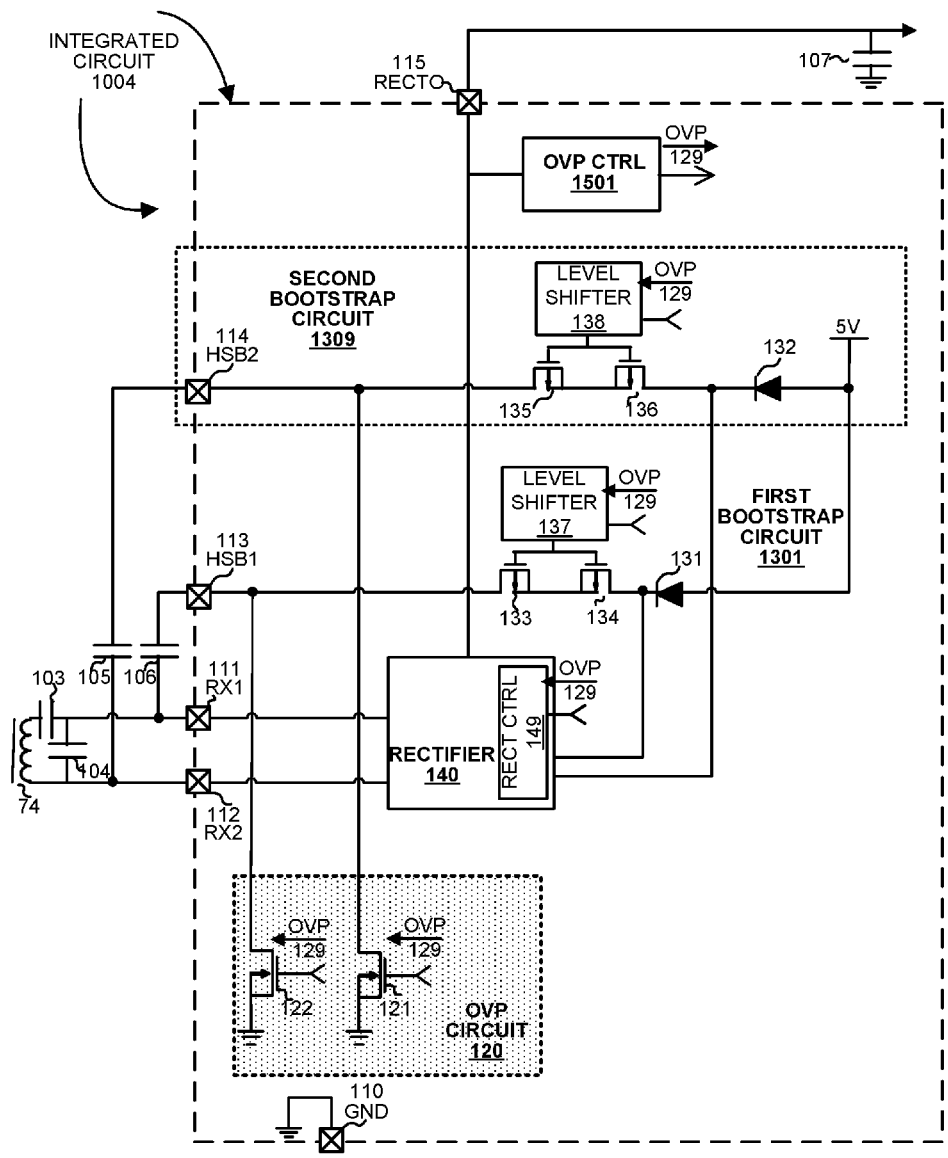
FIG. 6 shows an exemplary circuit diagram of an integrated circuit for a wireless power receiver where an OVP signal applies to bootstrap circuits.

FIG. 6 shows an exemplary circuit diagram of an integrated circuit 1004 for a wireless power receiver where OVP signal applies to bootstrap circuits. Integrated circuit 1004 includes an OVP circuit 120, an OVP control circuit 1501, a rectifier 140, a bootstrap circuit 1301 and a bootstrap circuit 1309. Bootstrap circuit 1301 and bootstrap circuit 1309 power high side switches of rectifier 140. Bootstrap circuit 1301 includes a serially connected bootstrap diode 131, a level shifter 137, a first bootstrap switch 133, and a second bootstrap switch 134. Similarly, bootstrap circuit 1309 includes a serially connected bootstrap diode 132, a level shifter 138, a first bootstrap switch 135, and a second bootstrap switch 136. Bootstrap switches 133, 134, 135 and 136 are P-type field effect transistors (FET), or other types of P-type transistors. A signal OVP 129 is asserted when OVP control circuit 1501 detects an over voltage condition. Signal OVP 129 drives OVP switch 121 and OVP switch 122 of OVP circuit 120. Signal OVP 129 is level shifted by level shifters 137 and 138. The level shifted signal OVP 129 drives bootstrap switches 133, 134, 135 and 136. When signal OVP 129 is asserted, it turns on OVP switches 121 and 122. When signal OVP 129 is asserted, it also turns off bootstrap switches 133, 134, 135 and 136. Signal OVP 129 also applies to rectifier controller 149. When signal OVP 129 is asserted, rectifier controller 149 disables rectifier switches in rectifier 140. When signal OVP 129 is deasserted, bootstrap switches 133, 134, 135 and 136 are turned on and OVP turned on and OVP switches 121 and 122 are disabled. When signal OVP 129 is deasserted, rectifier controller 149 also turns on switches in rectifier 140. Bootstrap switches 133, 134, 135 and 136 are set to be mutually exclusive with OVP switches 121 and 122. When bootstrap switches 133, 134, 135 and 136 are on, OVP switches 121 and 122 are turned off. Similarly, when OVP switches 121 and 122 are on, bootstrap switches 133, 134, 135 and 136 are disabled.

Figure 7:
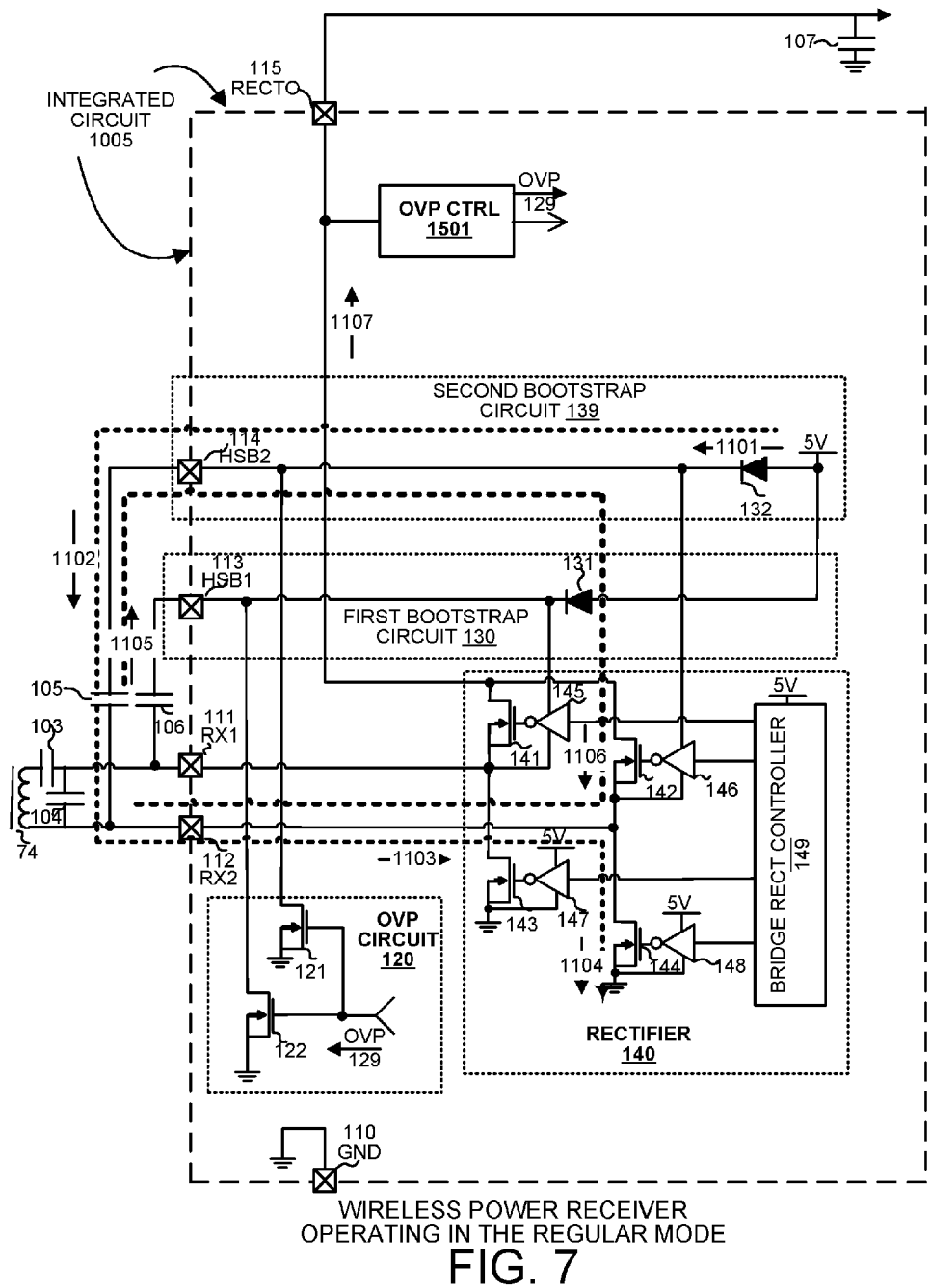
FIG. 7 shows an exemplary circuit diagram of an integrated circuit for a wireless power receiver operating in regular mode.

FIG. 7 shows an exemplary circuit diagram of an integrated circuit 1005 for a wireless power receiver operating in the regular mode. Integrated circuit 1005 includes a rectifier circuit 140, an OVP circuit 120 and bootstrap circuits 130 and 139. In the regular mode, rectifier 140 receives supply voltage from input terminals RX1 111 and RX2 112. Rectifier 140 outputs rectified voltage to a rectify output RECTO 115 via a current path 1107. In the regular mode, OVP circuit 120 is off. OVP switch 121 and OVP switch 122 are turned off.

Bootstrap circuit 139 powers high side switch 142 of rectifier 140 in the regular mode. When low side switch 144 is on and high side switch 142 is off, bootstrap switch 139 charges external capacitor 105, which is connected to a bootstrap terminal HSB2 114. The charging path includes path 1101 that flows through bootstrap diode 132 to HSB2 114, continues to path 1102 that charges capacitor 105, goes through path 1103 and 1104 to the ground. When high side switch 142 is turned on and low side switch 144 is turned off, capacitor 105 provides power to high side switch 142. The supply path includes path 1105 from the top plate of capacitor 105, and goes through terminal HSB2 114 and continues to path 1106, which passes through high side switch 142, which is turned on.

Similarly, external capacitor 106 is charged through bootstrap diode 132 in bootstrap circuit 139 during charging phase. During charging phase, high side switch 141 is turned off and low side switch 143 is turned on. When high side switch 141 is turned on and low side switch 143 is turned off, capacitor 106 powers high side switch 141.

Figure 8:
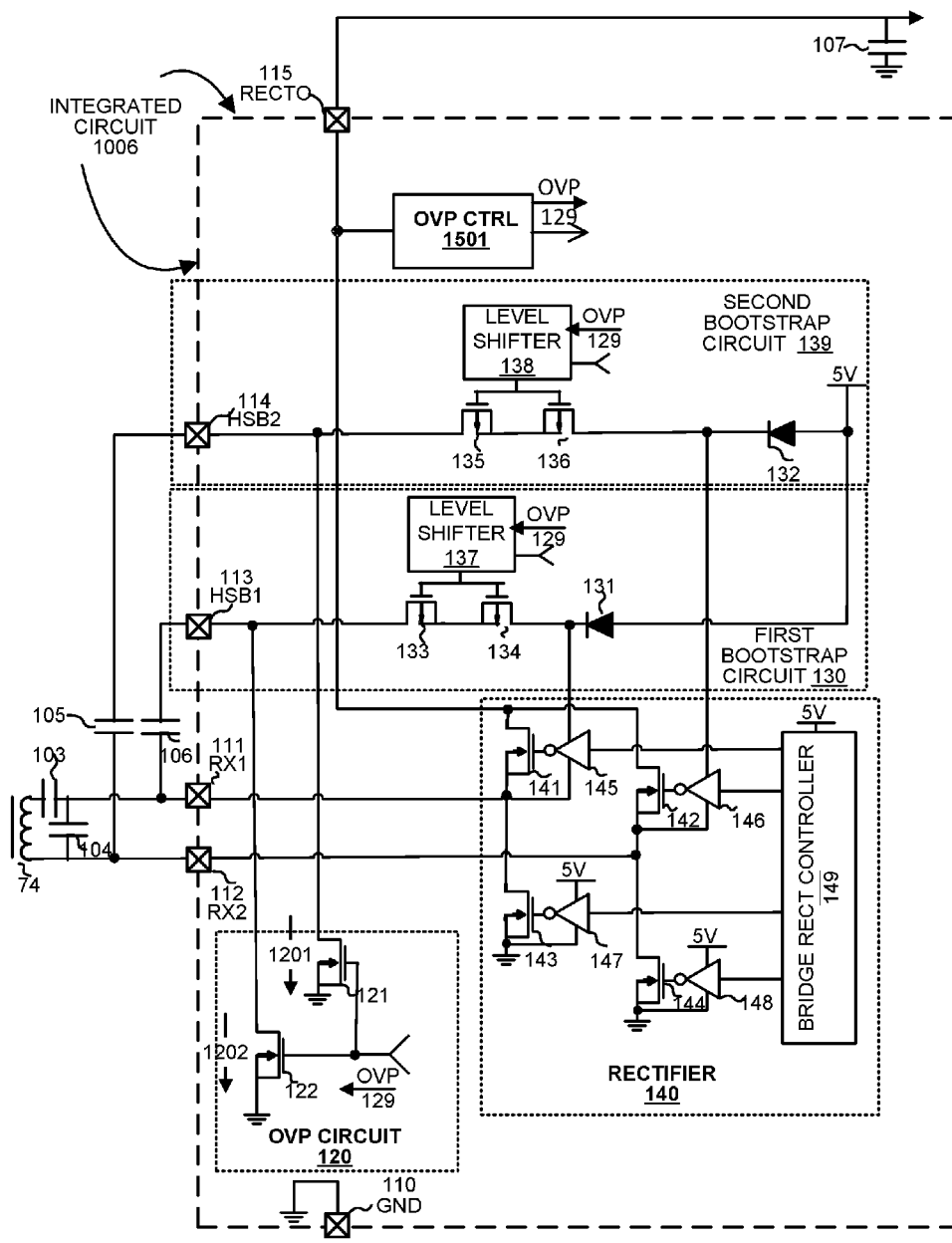
FIG. 8 shows an exemplary circuit diagram of an integrated circuit for a wireless power receiver operating in the OVP mode.

FIG. 8 shows an exemplary circuit diagram of an integrated circuit 1006 for a wireless power receiver operating in the OVP mode. Integrated circuit 1006 includes a rectifier circuit 140, an OVP circuit 120, an OVP control circuit 1501 and bootstrap circuits 130 and 139. When OVP control circuit 1501 detects an over voltage condition, signal OVP 129 is asserted. When signal OVP 129 is asserted, integrated circuit 1006 enters the OVP mode. In the OVP mode, rectifier 140 is turned off. The bootstrap switches 133, 134, 135, and 136 are turned off. External capacitors 105 and 106 are not needed to power the high side switches of rectifier 140. In the OVP mode, OVP circuit 120 is turned on. In one embodiment of the current invention, as shown in FIG. 8, OVP switch 121 is coupled between bootstrap terminal HSB2 114 and the ground. In the OVP mode, OVP switch 121 is on and pulls down one plate of external capacitor 105 to the ground via path 1201. Similarly, OVP switch 122 is coupled between bootstrap terminal HSB1 113 and the ground. In the OVP mode, OVP switch 122 is on and pulls down one plate of external capacitor 106 to the ground via path 1202. External capacitor 105 is coupled between input RX2 112 and HSB2 114. External capacitor 106 is coupled between input RX1 111 and HSB1 113. In the OVP mode, OVP circuit 120 uses external 105 and 106 as OVP capacitors. RX1 111 and RX2 112 are 112 are coupled via capacitors 105 and 106.

Figure 9:
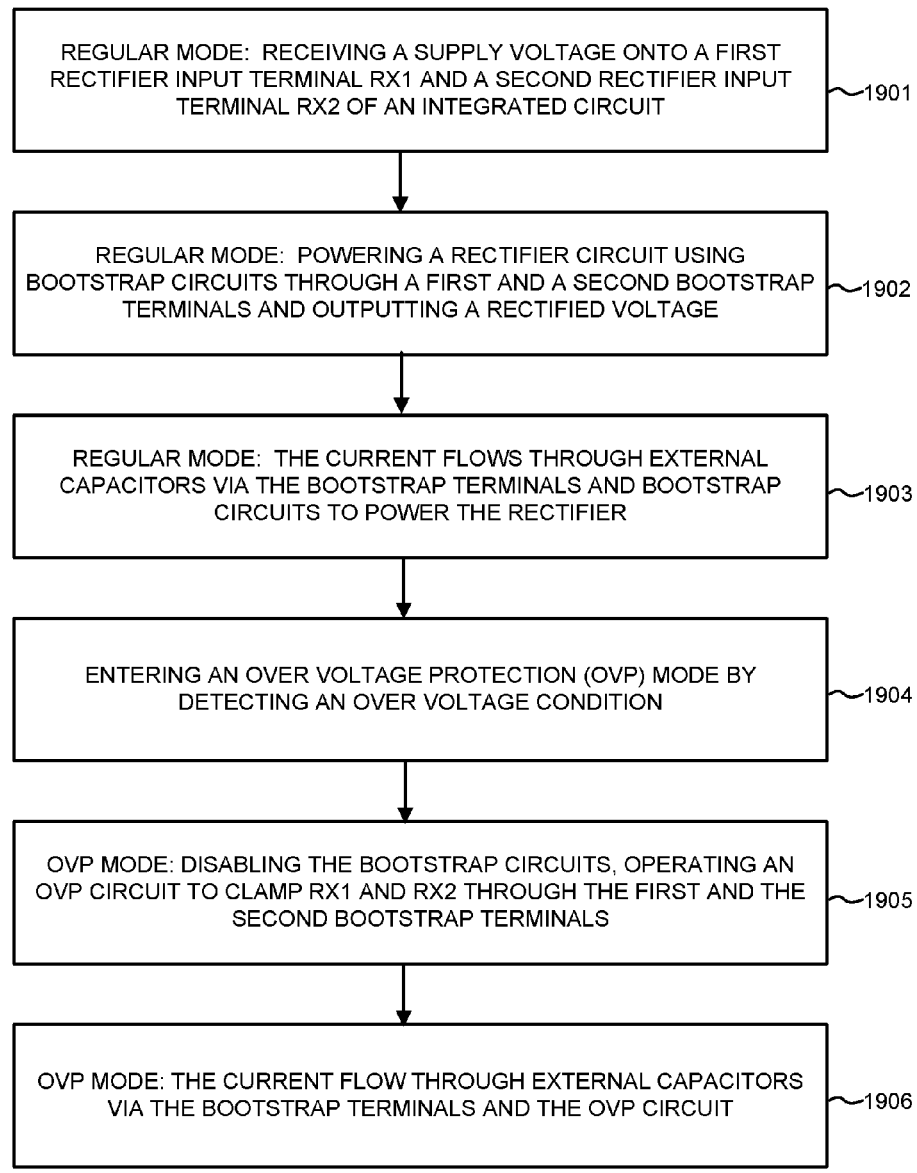
FIG. 9 is a flowchart of a method for bootstrap and OVP combination clamp in accordance with one novel aspect of the current invention.

FIG. 9 is a flowchart of a method in accordance with one novel aspect of the current invention. In the regular mode of the operation, the integrated circuit receives (step 1901) a supply voltage onto a first rectifier input terminal RX1 and second rectifier input terminal RX2. In the regular mode, the integrated circuit powers (step 1902) the rectifier circuit using bootstrap circuits through first and second bootstrap terminals and outputs a rectified voltage. In the regular mode, the current flows (step 1903) through external capacitors via the bootstrap terminals and bootstrap circuits to power the rectifier. The integrated circuit enters (step 1904) an over voltage protection (OVP) mode by detecting an over voltage condition. In the OVP mode, the integrated circuit disables (step 1905) the bootstrap circuits and operates an OVP circuit to clamp RX1 and RX2 through the first and the second bootstrap terminals. In the OVP mode, the current flows (step 1906) through external capacitors via the bootstrap terminals and the OVP circuit.

N-Type Load Switch Using Bootstrap Gate Drive

Figure 1:
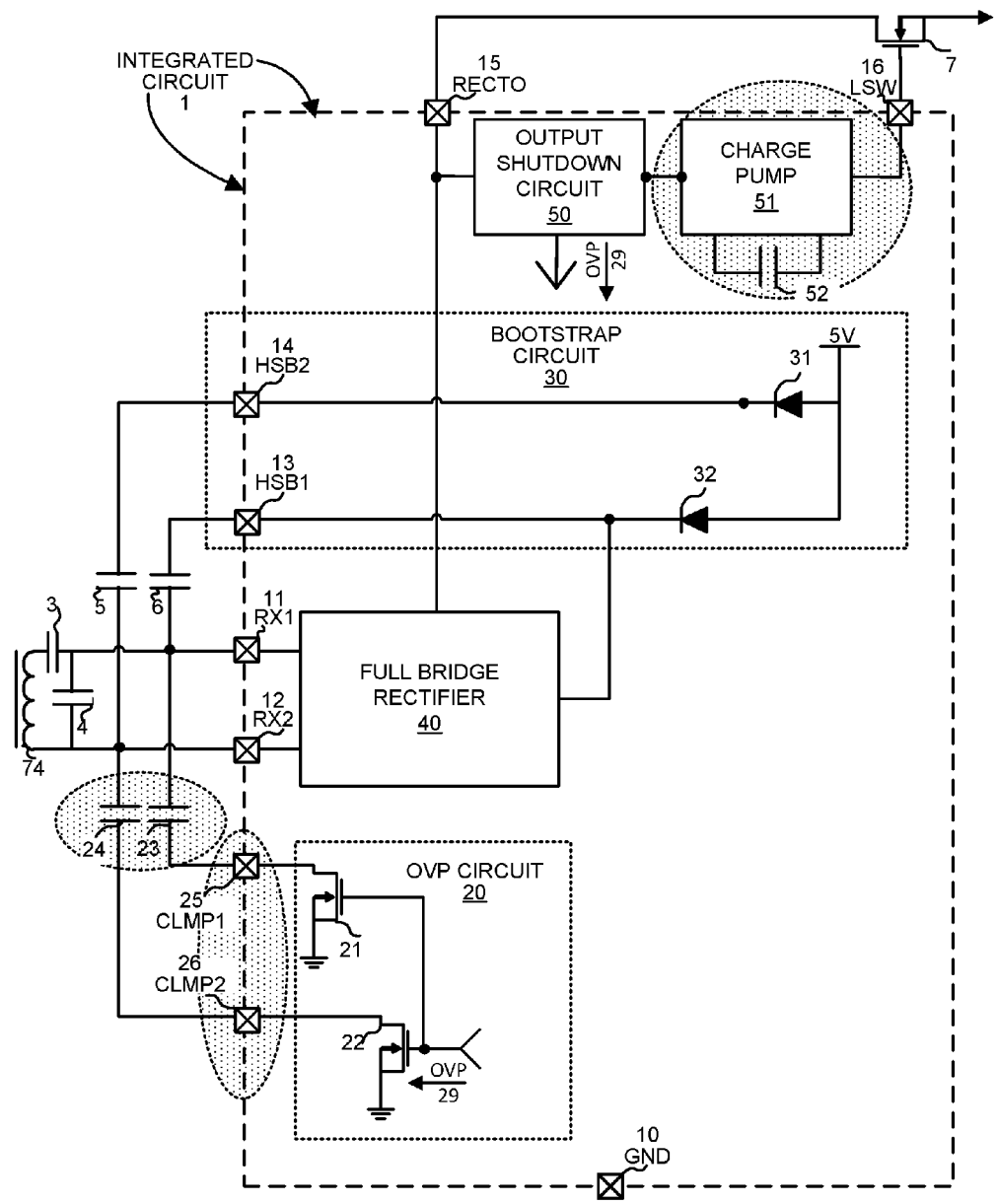
FIG. 1 shows prior art circuit diagram of an integrated circuit for a wireless power receiver.

One of the requirements for a wireless power receiver in a wireless power system is to have a separate load switch to shut off the output when an over voltage or other condition is reached. A PMOS can be used as the load switch, which is easy to drive. However, PMOS is much more expensive than an NMOS for the same RDS(on) and voltage rating. It is beneficial to change a P-type device, such as a PMOS to an N-type device, such as an NMOS. However, an NMOS requires voltage to be driven above the supply to fully enhance the NMOS and get the lowest RDS(on) possible. RDS(on) possible. Traditional ways, as shown in FIG. 1, require an extra charge pump, either internally or externally. Internal and external charge pumps both require at least one additional capacitor. Further, the internal pump takes up a large die area. The external pump requires additional terminals to connect the external capacitor. In one embodiment of the current invention, bootstrap capacitors are used to drive the N-type device gate, such as the NMOS gate without requiring an additional charge pump circuit.

Figure 10:
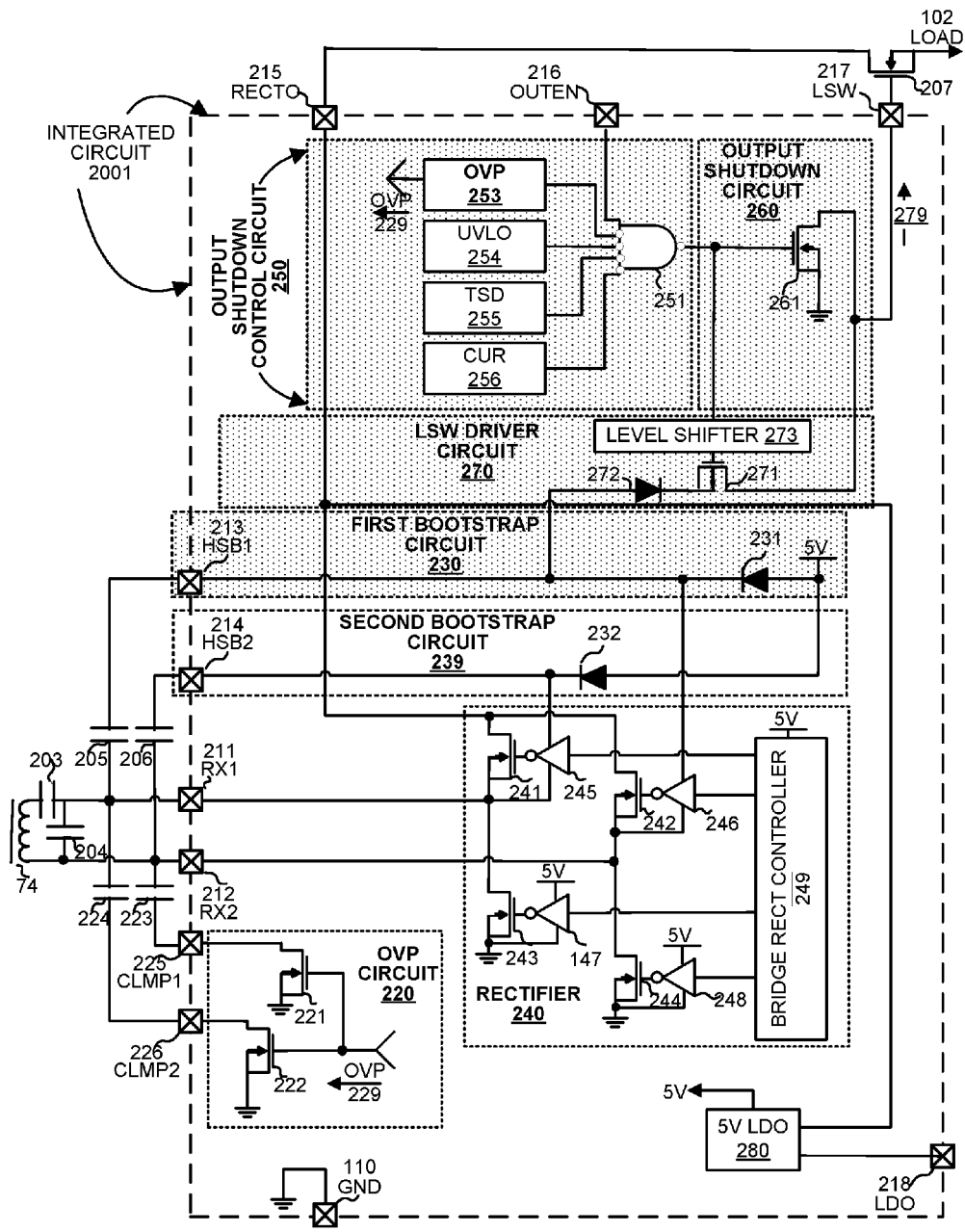
FIG. 10 shows an exemplary integrated circuit for a wireless power receiver that uses bootstrap capacitor to provide gate driver for an external N-type load switch.

FIG. 10 shows an exemplary integrated circuit 2001 for a wireless power receiver that uses bootstrap capacitor to provide gate driver for external N-type load switch. Integrated circuit 2001 has input terminals RX1 211 and RX2 212, two high side bootstrap terminals HSB1 213 and HSB2 214, an output terminal RECTO 215 and ground terminal GND 110. Integrated circuit 2001 has a rectifier circuit 240, two bootstrap circuits, bootstrap circuit 230 and bootstrap 239, an OVP circuit 220, an output-shutdown-control circuit 250 and an output shutdown circuit 260. In addition, integrated circuit 2001 also has a five-volt load output (LDO) terminal 218. A five-volt load output circuit 280 is connected to the rectified output and 5V LDO terminal 218.

A series capacitor 203 and a parallel capacitor 204 make up the dual resonant circuit with a secondary coil 74. Secondary coil 74 receives power from a power-transmitter coil in a power transmitter unit and passes through the secondary dual resonant circuit. The dual resonant circuit enhances the power transfer efficiency and enables a resonant detection method.

OVP circuit 220 includes an OVP switch 221 and an OVP switch 222. OVP switch 221 is coupled between an OVP clamping terminal CLMP1 225 and the ground. OVP switch 222 is coupled between an OVP clamping terminal CLMP2 226 and the ground. A signal OVP 229 drives OVP switch 221 and OVP switch 222. An external OVP capacitor 223 is coupled between RX2 212 and CLMP1 225. An external OVP capacitor 224 is coupled between RX1 211 and CLMP2 224. When signal OVP 229 is asserted upon detecting an over voltage condition, OVP switch 221 and OVP switch 222 turn on and pull CLMP1 225 and CLMP2 226 to the ground. External OVP capacitors 223 and 224 provide capacitive coupling between RX1 211 and RX2 212 and therefore clamp the input. The output voltage at RECTO 215 will drop back to the predefined level accordingly.

A full bridge rectifier circuit 240, coupled between input terminal RX1 211 and input terminal RX2 212, provides full-wave rectification of the AC waveform received from RX1 211 and RX2 212. The output of rectifier circuit 240 is connected to rectifier output terminal RECTO 215. Rectifier circuit 240 has two high side rectifier switches 241 and 242. Rectifier circuit 240 also has two low side rectifier switches 243 and 244. Each rectifier switch 241, 242, 243 and 244 is controlled by a bridge rectifier controller 249 and is each connected with inverters 245, 246, 247 and 248, respectively. Full bridge rectifier circuit 240 uses bootstrap circuits to power its two high side switches.

A bootstrap circuit 230 of integrated circuit 2001 includes a bootstrap diode 231 that is connected to HSB1 213 and a low power source. The low power source as shown in FIG. 10 is 5 volts. Bootstrap circuit 230 powers high side switch 242 via inverter 246. Similarly, a bootstrap circuit 239 of integrated circuit 2001 includes a bootstrap diode 232 that is connected to HSB2 214 and the low power source. Bootstrap circuit 239 powers high side switch 241 via inverter 245. External bootstrap capacitor 205, coupled between RX1 211 and HSB1 213, is charged when high side switch 242 is turned off. External bootstrap capacitor 205 provides power to high side switch 242 when high side switch 242 is turned on. Similarly, external bootstrap capacitor 206, coupled between RX2 212 and HSB2 214, is charged when high side switch 241 is turned off. External bootstrap capacitor 206 provides power to high side switch 241 when high side switch 241 is turned on.

Output-shutdown-control circuit 250 detects various signals and outputs an output shutdown signal to turn on or off a load switch. Output-shutdown-control circuit 250 has a logic gate 251. Logic gate 251 takes different input signals and outputs a control signal. The inputs of logic gate 251 can be various internal conditions. Examples of internal condition detection circuits include, an over voltage (OVP) circuit 253, an under voltage lockout (UVLO) circuit 254, a thermal shutdown (TSD) circuit 255, and a current limit and sense circuit 256. The input signal can also include external signals, such as an output enable signal from an output enable terminal OUTEN 216. Upon detecting one or more signals that indicate an output shutdown condition, an output shutdown signal is asserted. Integrated circuit 2001 enters the output shutdown mode. If all the output shutdown conditions are cleared, the output shutdown signal is deasserted and integrated circuit 2001 enters the regular mode. Logic gate 251 outputs output shutdown signal that drives output shutdown circuit 260 and a load switch (LSW) driver circuit 270. LSW driver circuit 270 includes a level shifter 273.

An external load switch 207 is coupled between a LSW terminal 217 and RECTO 215. When an output shutdown signal is asserted, integrated circuit 2001 enters the output shutdown mode. Output shutdown circuit 260 is on. Output shutdown circuit 260 includes an output shutdown switch 261. Output shutdown switch 261 is coupled between LSW terminal 217 and the ground. When output shutdown signal is asserted, output shutdown switch 261 is turned on. Output shutdown switch 261 pulls LSW terminal 217 to the ground. Load switch 207 is shutdown. There is no output from load switch 207.

In the regular mode, load switch 207 needs to be turned on to provide output from RECTO. An N-type switch is less expensive than a P-type switch. However, it requires gate drive that supplies voltage above the source. As shown in FIG. 10, load switch 207 is an NMOS. In the regular mode, LSW driver circuit 270 provides gate drive to turn on load switch 207. LSW driver circuit 270 is coupled between the LSW terminal 217 and HSB1 213. LSW driver circuit 270 includes a serially connected LSW driver diode 272 and a LSW driver switch 271. Level shifter 273 level shifts output signal of output-shutdown-control circuit 250 and drives LSW driver switch 271. In the regular mode, LSW driver switch 271 is turned on. LSW driver switch 271 provides a direct path to power load switch 207 through LSW terminal 217. The charged external capacitor 205 powers load switch 207 through HSB1 passing LSW driver diode and LSW driver switch 271. LSW driver circuit 270 provides a control voltage 279 to load switch 207. By powering load switch 207 through external bootstrap capacitor 205, no external or internal charge pump is needed.

Although bootstrap circuit 230 and capacitor 205 is shown to power load switch 207, either bootstrap circuit can be used to accomplish the same function. Similarly, bootstrap circuit 239 can power load switch 207 through external capacitor 206 in the same way.

Figure 11:
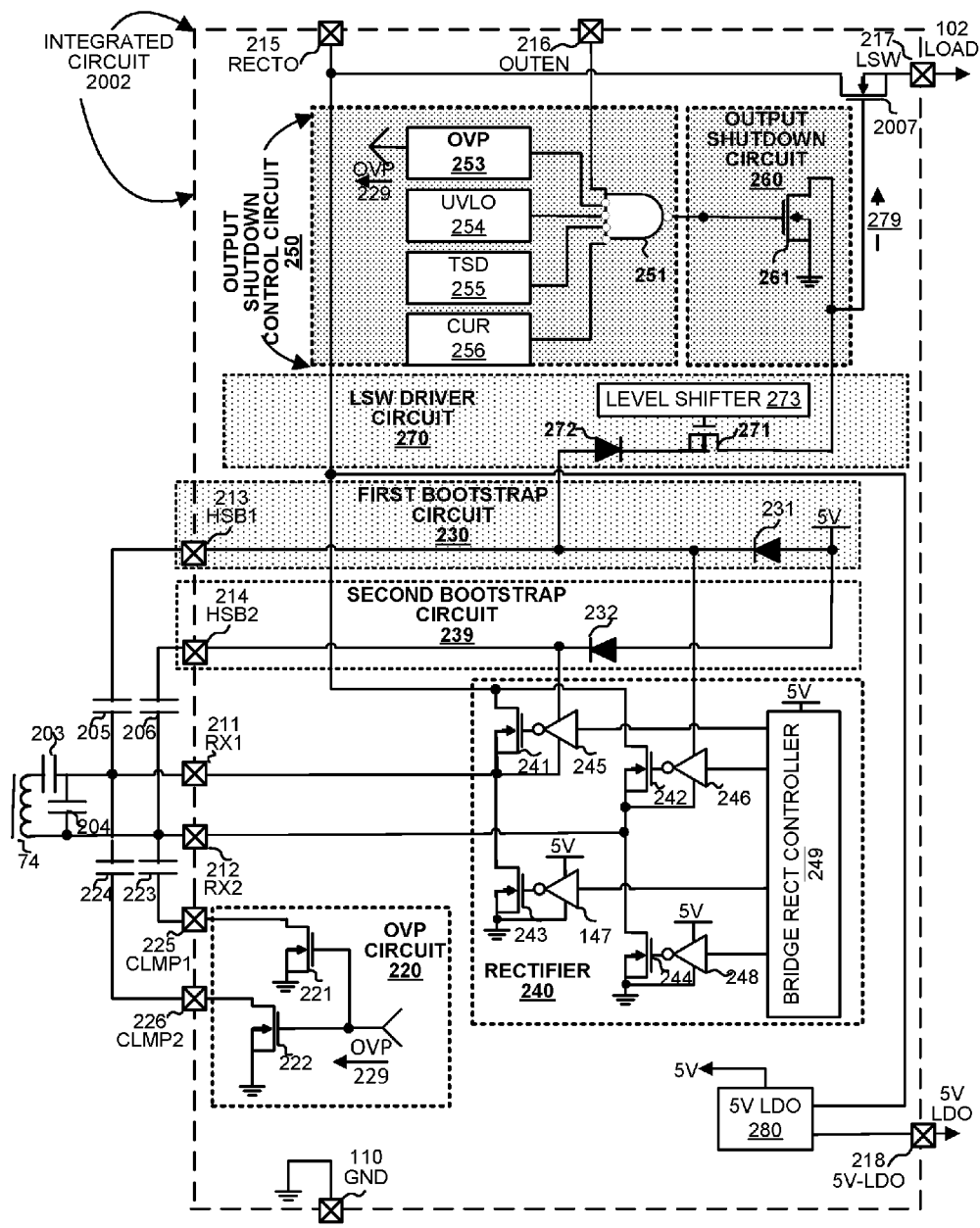
FIG. 11 shows an exemplary integrated circuit for a wireless power receiver that uses bootstrap capacitor to provide gate driver for an internal N-type load switch.

FIG. 11 shows an exemplary integrated circuit 2002 for a wireless power receiver that uses bootstrap capacitor to provide gate driver for an internal N-type load switch. Integrated circuit 2002 has input terminals RX1 211 and RX2 212, two high side bootstrap terminals HSB1 213 and HSB2 214, an output terminal RECTO 215 and ground terminal GND 110. Integrated circuit 2002 has a rectifier circuit 240, two bootstrap circuits, bootstrap circuit 230 and bootstrap 239, an OVP circuit 220, an output-shutdown-control circuit 250 and an output shutdown circuit 260. Similar to integrated circuit 2001, a LSW driver circuit 270 uses external bootstrap capacitor 205 to provide gate drive to a load switch. Unlike load switch 207, load switch 2007 is an internal switch of integrated circuit 2002. Load switch 2007 is coupled between rectified output and a LSW terminal 217. LSW driver circuit 270 provides gate drive to internal load switch 2007. LSW driver circuit 270 includes level shifter 273.

In the shutdown mode, integrated circuit 2002 receives shutdown output from LSW terminal 217. Similar to integrated circuit 2001, output shutdown circuit 260 is on. Output shutdown switch 261 pulls down the gate of load switch 2007 to the ground. Load switch 2007 is off.

Very similar to integrated circuit 2001, in the regular mode, LSW driver switch 271 is turned on. LSW driver switch 271 provides a direct path to power load switch 2007. The charged external capacitor 205 powers load load switch 2007 through HSB1 passing LSW driver diode 272 and LSW driver switch 271. LSW driver circuit 270 provides a control voltage 279 to load switch 2007. By powering load switch 2007 through external bootstrap capacitor 205, no external or internal charge pump is needed.

Although bootstrap circuit 230 and capacitor 205 is shown to power load switch 2007, either bootstrap circuit can be used to accomplish the same function. Similarly, bootstrap circuit 239 can power load switch 2007 through external capacitor 206 in the same way.

Figure 12:
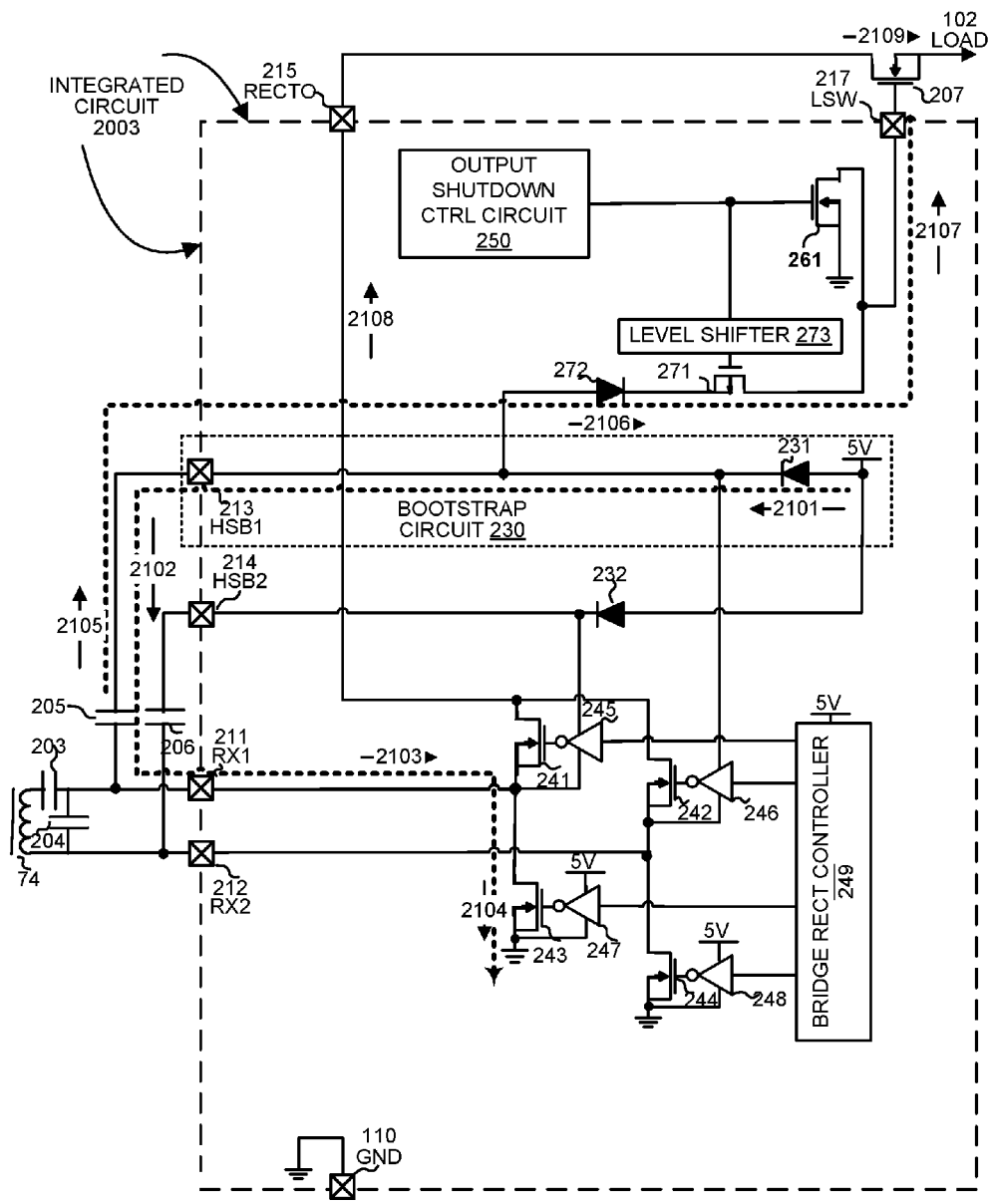
FIG. 12 shows an exemplary wireless power receiver operating in the regular mode.

FIG. 12 shows an exemplary integrated circuit 2003 for a wireless power receiver operating in the regular mode. In the regular mode, integrated circuit 2003 outputs rectified voltage to RECTO terminal 215 via path 2108. A LSW driver switch 217 is turned on and provides direct path to a load switch 207. When a low side switch 244 is on and a high side switch 242 is off, a bootstrap circuit 230 charges an external capacitor 205, which is connected to a high side bootstrap terminal HSB1 213. The charging path includes a path 2101 that flows through a bootstrap diode 231 to HSB1 213, continues to a path 2102 that charges capacitor 205, goes through path 2103 and 2104 to the ground. When high side switch 242 is turned on and low side switch 244 is turned off, capacitor 205 provides charge power to high side rectifier switch 242, it also provides gate drive to load switch 207. The path includes path 2105 going from capacitor 205 to HSB1 213, path 2106 that passes through LSW driver diode 272 and LSW driver switch 271, which is turned on. Level shifter 273 is coupled between LSW driver switch 271 and output-shutdown-control circuit control circuit 250. Load switch 207 is powered and turned on. Rectified output passes through load switch 207 via path 2109.

Figure 13:
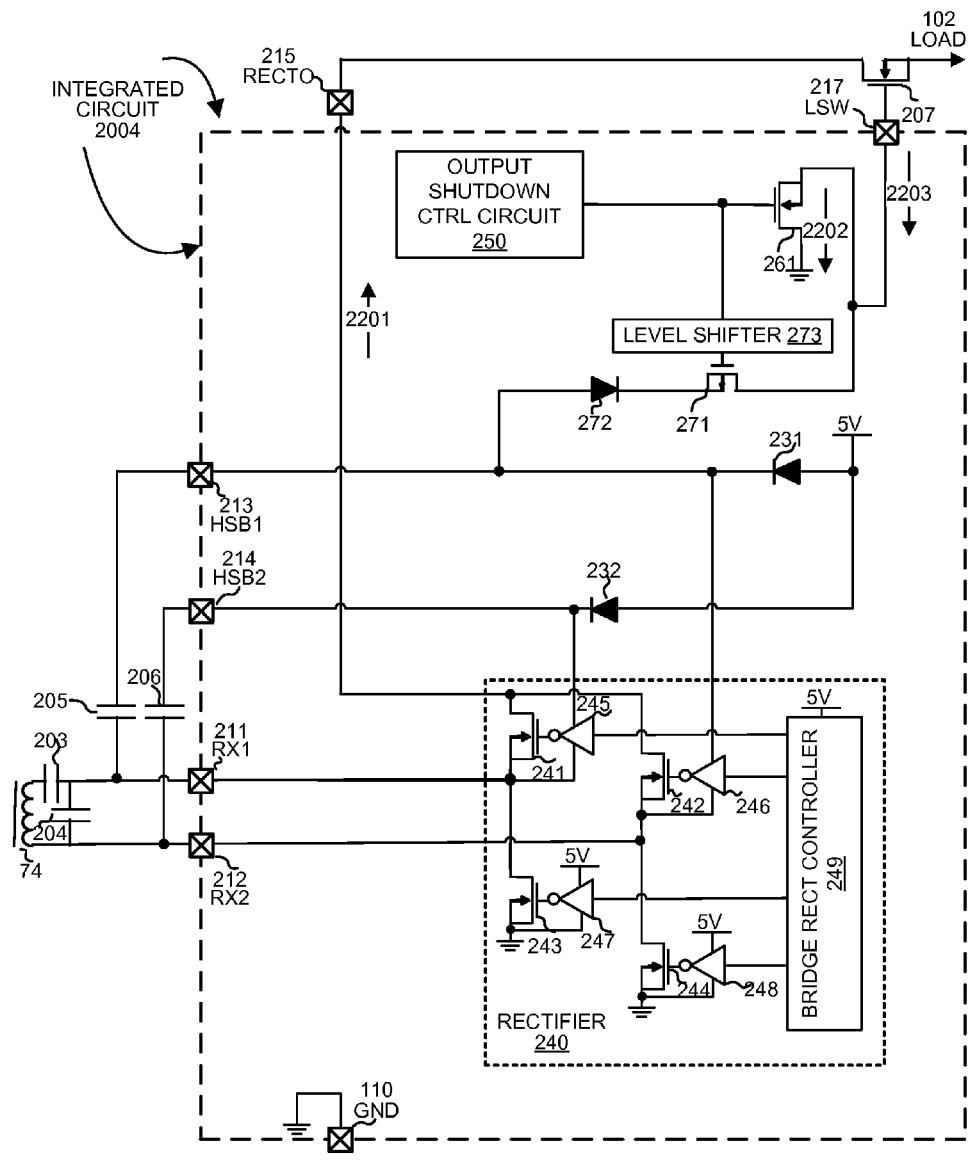
FIG. 13 shows an exemplary wireless power receiver operating in the output shutdown mode.

FIG. 13 shows an exemplary integrated circuit 2004 for a wireless power receiver operating in the output shutdown mode. In the output shutdown mode, integrated circuit 2004 turns off a load switch 207. A rectifier circuit 240 may still send output to RECTO 215 via path 2201. In the output shutdown mode, an output shutdown switch 261 is on and pulls a LSW terminal 217 to the ground. The gate of load switch 207 is pulled down to the ground via path 2203 and 2202. Load switch 207 is shutdown. There is no output through load switch 207. Level shifter 273 is coupled between LSW driver switch 271 and output-shutdown-control circuit 250.

Figure 14:
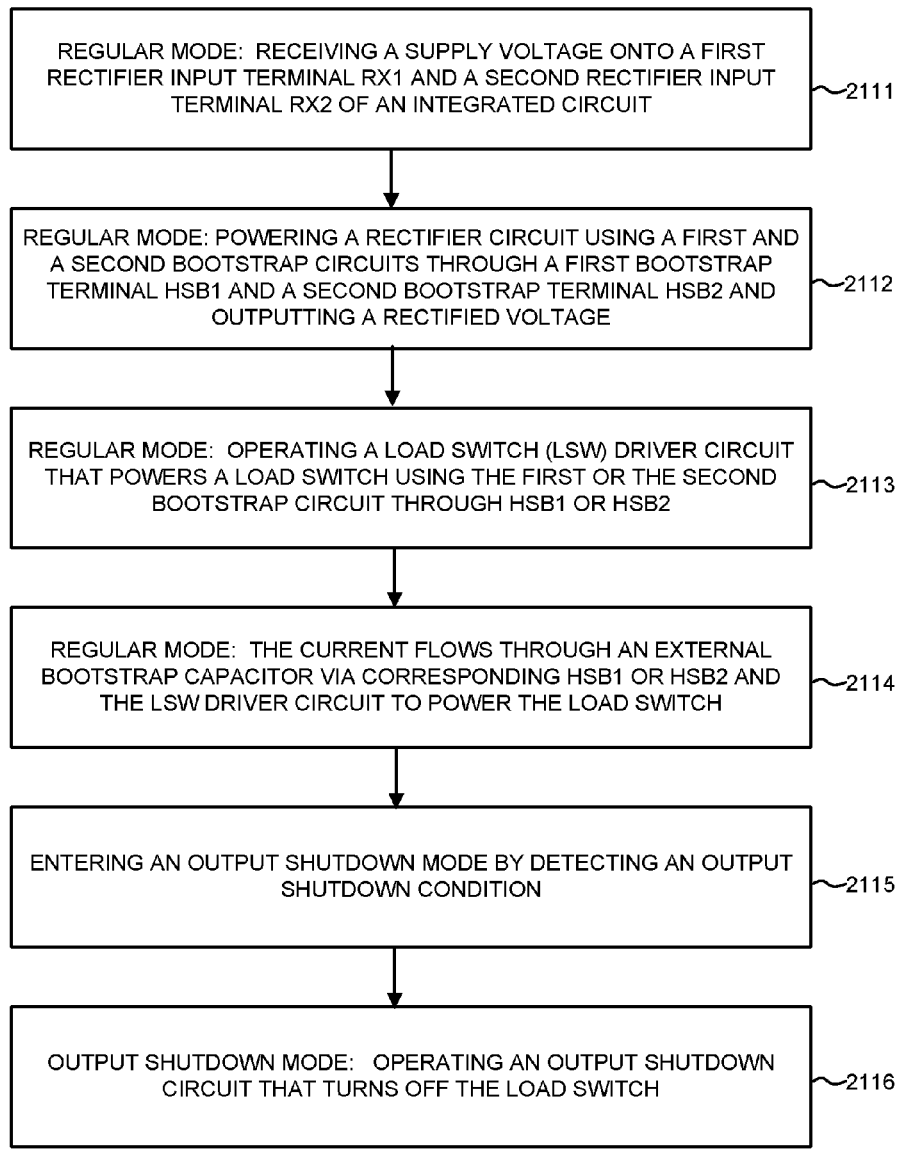
FIG. 14 is a flowchart of a method for using bootstrap to provide gate drive to NMOS load switch in accordance with one novel aspect of the current invention.

FIG. 14 is a flowchart of a method for using bootstrap to provide gate drive to NMOS load switch in accordance with one novel aspect of the current invention. In the regular mode of the operation, the integrated circuit receives (step 2111) a supply voltage onto a first rectifier input terminal RX1 and a second rectifier input terminal RX2. In the regular mode, the integrated circuit powers (step 2112) the rectifier circuit using first and second bootstrap circuits through a first bootstrap terminal HSB1 and a second bootstrap terminal HSB2 and outputs a rectified voltage. In the regular mode, the integrated circuit operates (step 2113) a load switch driver circuit that powers a load switch using the first or the second bootstrap circuit through HSB1 or HSB2. In the regular mode, the current flows (step 2114) through an external bootstrap capacitor via corresponding HSB1 or HSB2 and the LSW driver circuit to power the load switch. The integrated circuit integrated circuit enters (step 2115) an output shutdown mode by detecting an output shutdown condition. In the output shutdown mode, the integrated circuit operates (2116) an output shutdown circuit that turns off the load switch.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus comprising:
   a first rectifier input terminal (RX1);
   a second rectifier input terminal (RX2);
   a rectifier output terminal (RECTO);
   a rectifier circuit coupled between the first rectifier input terminal (RX1) and the second rectifier input terminal (RX2), wherein the rectifier circuit outputs a rectified voltage onto the rectifier output terminal (RECTO);
   a first bootstrap terminal (HSB1);
   a first bootstrap circuit coupled to the first bootstrap terminal (HSB1), wherein in a regular mode the first bootstrap circuit supplies power to the rectifier circuit;
   a second bootstrap terminal (HSB2);
   a second bootstrap circuit coupled to the second bootstrap terminal (HSB2), wherein in the regular mode the second bootstrap circuit supplies power to the rectifier circuit;

a load switch driver circuit coupled to either the first bootstrap terminal (HSB1) or the second bootstrap terminal (HSB2), wherein in the regular mode the load switch driver circuit provides a control voltage to a load switch;

a load switch terminal (LSW) coupled to the load switch; and an output shutdown circuit, wherein the output shutdown circuit is turned on in an output shutdown mode to turn off the load switch.

2. The apparatus of claim 1, wherein the apparatus is an integrated circuit of a wireless power receiver.

3. The apparatus of claim 2, wherein the load switch is internal to the integrated circuit, and wherein the load switch supplies the rectified voltage onto the load switch terminal (LSW).

4. The apparatus of claim 2, wherein the load switch is external to the integrated circuit, and wherein the control voltage is supplied to the load switch through the load switch terminal (LSW).

5. The apparatus of claim 1, further comprising an output shutdown control circuit, wherein the output shutdown control circuit outputs an output shutdown signal.

6. The apparatus of claim 5, wherein the output shutdown control circuit is a logic gate, and wherein the output shutdown signal is asserted when detecting one or more conditions comprising:
an output disable condition;
a thermal shutdown condition;
an over voltage protection (OVP) condition;
an under voltage lock out (UVLO) condition; and
a current limit condition.

7. The apparatus of claim 5, wherein the output shutdown circuit is turned on and the load switch driver circuit is turned off in the output shutdown mode when the output shutdown signal is asserted.

8. The apparatus of claim 5, wherein the output shutdown circuit is turned off and the load switch driver circuit is turned on in the regular mode when the output shutdown signal is deasserted.

9. A method comprising:
in a regular mode receiving a supply voltage onto a first rectifier input terminal (RX1) and a second rectifier input terminal (RX2) of an integrated circuit;
in the regular mode powering a rectifier circuit using a first bootstrap circuit and a second bootstrap circuit through a first bootstrap terminal (HSB1) and a second bootstrap terminal (HSB2) and outputting a rectified voltage onto a rectifier output terminal (RECTO);
in the regular mode operating a load switch driver circuit that powers a load switch using the first or the second bootstrap circuit through the first bootstrap terminal (HSB1) or the second bootstrap terminal (HSB2);
entering an output shutdown mode by detecting an output shutdown condition; and
in the output shutdown mode operating an output shutdown circuit that turns off the load switch.

10. The method of claim 9, wherein in the regular mode the current flows through an external bootstrap capacitor via corresponding first bootstrap terminal (HSB1) or second bootstrap terminal (HSB2) and the load switch driver circuit to power the load switch.

11. The method of claim 9, further comprises:
detecting an output shutdown condition; and
asserting an output shutdown signal when the output shutdown condition is detected.

12. The method of claim 11, wherein the output shutdown condition is detected when detecting one or more conditions comprising:
an output disable condition;
a thermal shutdown condition;
an over voltage protection (OVP) condition;
an under voltage lock out (UVLO) condition; and
a current limit condition.

13. The method of claim 11, wherein the output shutdown mode is entered when the output shutdown signal is asserted indicating a detection of an output shutdown condition, and wherein the regular mode is entered when the output shutdown signal is deasserted.

14. An apparatus comprising:
a first rectifier input terminal (RX1);
a second rectifier input terminal (RX2), wherein the first rectifier input terminal (RX1) and the second rectifier input terminal (RX2) provide an input voltage to a rectifier circuit that outputs a rectified voltage onto a rectifier output terminal (RECTO);
a first bootstrap terminal (HSB1);
a second bootstrap terminal (HSB2), wherein the first bootstrap terminal (HSB1) and the second bootstrap terminal (HSB2) are coupled with a first and a second bootstrap circuit to power the rectifier circuit in a regular mode;
an output shutdown circuit, wherein the output shutdown circuit is turned on in an output shutdown mode to turn off a load switch; and
means for powering the load switch in the regular mode through either the first bootstrap terminal (HSB1) or the second bootstrap terminal (HSB2) using a corresponding bootstrap circuit.

15. The apparatus of claim 14, wherein the apparatus is an integrated circuit of a wireless power receiver.

16. The apparatus of claim 15, wherein the load switch is internal to the integrated circuit.

17. The apparatus of claim 15, wherein the load switch is external to the integrated circuit and connected to the load switch terminal (LSW).

18. The apparatus of claim 14, wherein the means is also for:
detecting an output shutdown condition; and
asserting an output shutdown signal when the output shutdown condition is detected.

19. The apparatus of claim 18, wherein the output shutdown condition is detected when detecting one or more conditions comprising:
an output disable condition;
a thermal shutdown condition;
an over voltage protection (OVP) condition;
an under voltage lock out (UVLO) condition; and
a current limit condition.

20. The apparatus of claim 18, wherein the output shutdown mode is entered when the output shutdown signal is asserted, and wherein the regular mode is entered when the output shutdown signal is deasserted.

* * * * *